(12) United States Patent
Gandikota et al.

(10) Patent No.: US 12,112,951 B2
(45) Date of Patent: Oct. 8, 2024

(54) INTEGRATED DIPOLE REGION FOR TRANSISTOR

(71) Applicant: Applied Materials, Inc., Santa Clara, CA (US)

(72) Inventors: Srinivas Gandikota, Santa Clara, CA (US); Yixiong Yang, Fremont, CA (US); Steven C. H. Hung, Sunnyvale, CA (US); Tianyi Huang, Santa Clara, CA (US); Seshadri Ganguli, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 326 days.

(21) Appl. No.: 17/673,905

(22) Filed: Feb. 17, 2022

(65) Prior Publication Data

US 2023/0260791 A1    Aug. 17, 2023

(51) Int. Cl.
*H01L 21/28* (2006.01)
*H01L 21/324* (2006.01)
*H01L 21/8238* (2006.01)

(52) U.S. Cl.
CPC .. *H01L 21/28088* (2013.01); *H01L 21/28185* (2013.01); *H01L 21/324* (2013.01);
(Continued)

(58) Field of Classification Search
CPC ......... H01L 21/28088; H01L 21/28185; H01L 21/324; H01L 21/823807
(Continued)

(56) References Cited

U.S. PATENT DOCUMENTS 6,150,680 A    11/2000    Eastman et al.
8,168,547 B2    5/2012    Nabatame
(Continued)

FOREIGN PATENT DOCUMENTS

CN    103413832 A    11/2013
KR    20140086609 A    7/2014
WO    9945594 A1    9/1999

OTHER PUBLICATIONS

PCT International Search Report and Written Opinion in PCT/US2023/013132 dated Jun. 1, 2023, 9 pages.
(Continued)

*Primary Examiner* — Quoc D Hoang
(74) *Attorney, Agent, or Firm* — Servilla Whitney LLC (57) ABSTRACT

Methods of manufacturing and processing semiconductor devices (i.e., electronic devices) are described. Embodiments of the disclosure advantageously provide electronic devices which comprise an integrated dipole region to meet reduced thickness and lower thermal budget requirements. The electronic devices described herein comprise a source region, a drain region, and a channel separating the source region and the drain region, and a dipole region having an interfacial layer, a metal film substantially free of non-metal atoms on the interfacial layer, and a high-κ dielectric layer on the metal film. In some embodiments, the dipole region of the electronic devices comprises an interfacial layer, a high-κ dielectric layer on the interfacial layer, and a metal film on the high-κ dielectric layer. In some embodiments, the methods comprise annealing the substrate to drive particles of metal from the metal film into one or more of the interfacial layer or the high-κ dielectric layer.

9 Claims, 6 Drawing Sheets

(52) U.S. Cl.
CPC ............... *H01L 21/823807* (2013.01); *H01L 21/823857* (2013.01)

(58) Field of Classification Search
USPC ....................................................... 257/369
See application file for complete search history.

(56) References Cited

U.S. PATENT DOCUMENTS

| | | | |
|---|---|---|---|
| 8,420,474 | B1 | 4/2013 | Frank et al. |
| 11,018,232 | B2 | 5/2021 | Lin et al. |
| 11,132,177 | B2 | 9/2021 | Hekmatshoartabari et al. |
| 2007/0158702 | A1 | 7/2007 | Doczy et al. |
| 2010/0327366 | A1* | 12/2010 | Manabe .......... H01L 21/823842 257/369 |
| 2011/0006359 | A1 | 1/2011 | Anderson et al. |
| 2011/0127616 | A1 | 6/2011 | Hoentschel |
| 2011/0147798 | A1 | 6/2011 | Radosavljevic et al. |
| 2012/0184093 | A1 | 7/2012 | Chudzik et al. |
| 2013/0099328 | A1 | 4/2013 | Xu et al. |
| 2015/0262887 | A1 | 9/2015 | Xu et al. |
| 2015/0279745 | A1 | 10/2015 | Xu et al. |
| 2016/0148934 | A1 | 5/2016 | Ji et al. |
| 2017/0179252 | A1 | 6/2017 | Tang et al. |
| 2019/0088798 | A1 | 3/2019 | Kim et al. |
| 2019/0148237 | A1 | 5/2019 | Wang |
| 2019/0279913 | A1 | 9/2019 | Gluschenkov et al. |
| 2020/0119164 | A1 | 4/2020 | Tsau et al. |
| 2020/0373331 | A1 | 11/2020 | Kim et al. |
| 2020/0373404 | A1 | 11/2020 | Lin et al. |
| 2021/0005664 | A1 | 1/2021 | Fratin et al. |
| 2021/0028285 | A1 | 1/2021 | Chang et al. |
| 2021/0098581 | A1 | 4/2021 | Lin et al. |

OTHER PUBLICATIONS

PCT International Search Report and Written Opinion in PCT/US2020/033623 dated Oct. 20, 2020, 12 pages.
PCT International Search Report and Written Opinion in PCT/US2020/053182 dated Jan. 15, 2021, 12 pages.
Jeon, et al., "Plasma-Enhanced Atomic Layer Deposition of TiAlN: Compositional and Optoelectronic Tunability", Mar. 2019, ACS Appl. Mater. Interfaces, 2019, 11, 12, 11602-11611(Year:2019).
Lin, Yu-Hsian, et al., "Work Function Adjustment by Using Dipole Engineering for TaN—Al2O3—Si3N4—HfSiOx-Silicon Nonvolatile Memory", Materials 2015, 8, 5112-5120; doi: 10.3390/ma8085112, Aug. 7, 2015.

* cited by examiner

INTEGRATED DIPOLE REGION FOR TRANSISTOR

TECHNICAL FIELD

Embodiments of the present disclosure pertain to the field of electronic device manufacturing, and in particular, to transistors. More particularly, embodiments of the disclosure are directed to FinFET and GAA devices and methods of manufacturing FinFET and GAA devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

As device dimensions have shrunk, device geometries and materials have experienced difficulty maintaining switching speeds without incurring failures. Several new technologies emerged that allowed chip designers to continue shrinking gate lengths. Control of the dimensions of device structure is a key challenge for present and future technology generations.

Shrinking of the materials currently used as N- and P-MOS have become a challenge due to change in basic properties, such as threshold voltage ($V_t$). Additionally, the migration of transistor technology from planar to FinFET requires conformal work function layers for multiple threshold voltages. The $V_t$ tuning range will be limited by the film thickness variation with further scaling down of device sizes. There are also challenges associated with conventional dipole engineering techniques. To achieve the desired dipole effect, the desired element is driven from a deposited film with spike anneal and removed after drive in. The spike anneal can potentially cause an equivalent oxide thickness (EOT) penalty and high thermal budget because free oxygen atoms in the gate dielectric layers and the overlaying dipole stack diffuse downward to oxidize the underlying silicon layer.

Accordingly, there is a need for electronic devices and methods of manufacturing such electronic devices having an integrated dipole region to meet reduced thickness and lower thermal budget requirements.

SUMMARY

One or more embodiments of the disclosure are directed to electronic devices. In one or more embodiments, an electronic device comprises: a source region, a drain region and a channel separating the source region and drain region; and a dipole region on a top surface of the channel, the dipole region comprising an interfacial layer, a metal film on the interfacial layer, and a high-κ dielectric layer on the metal film. In one or more embodiments, an electronic device comprises: a source region, a drain region and a channel separating the source region and drain region; and a dipole region on a top surface of the channel, the dipole region comprising an interfacial layer, a high-κ dielectric layer on the interfacial layer, and a metal film on the high-κ dielectric layer.

Additional embodiments of the disclosure are directed to methods of manufacturing electronic devices comprising depositing an interfacial layer on a top surface of a channel located between a source and a drain on a substrate; depositing a metal film on the interfacial layer; and depositing a high-κ dielectric layer on the metal film to form a dipole region. In some embodiments, methods of manufacturing electronic devices comprise depositing an interfacial layer on a top surface of a channel located between a source and a drain on a substrate; depositing a high-κ dielectric layer on the interfacial layer; and depositing a metal film on the high-κ dielectric layer to form a dipole region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors are voltage-controlled devices where its current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated IS and current entering the channel at the drain (D) is designated ID. Drain-to-source voltage is designated VDS. By applying voltage to gate (G), the current entering the channel at the drain (i.e., ID) can be controlled.

The metal-oxide-semiconductor field-effect transistor (MOSFET) is a type of field-effect transistor (FET) and is used in integrated circuits and high-speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET, is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode and saturation. Circuits with NMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS ICs would be smaller than PMOS ICs (that give the same functionality), since the NMOS can provide one-half of the impedance provided by a PMOS (which has the same geometry and operating conditions).

As used herein, the term "fin field-effect transistor (FinFET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

Embodiments of the present disclosure advantageously provide electronic devices which comprise an integrated dipole region to meet reduced thickness and lower thermal budget requirements. In conventional dipole engineering techniques, to achieve the desired dipole effect, the desired element is driven from a deposited film with spike anneal and removed after drive in. The spike anneal can potentially cause an equivalent oxide thickness (EOT) penalty and high thermal budget because free oxygen atoms in the gate dielectric layers and the overlaying dipole stack diffuse downward to oxidize the underlying silicon layer. Embodiments of the present disclosure advantageously provide electronic devices which comprise an integrated dipole region that may achieve desired dipole effect without an annealing process.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

Figure 1A:
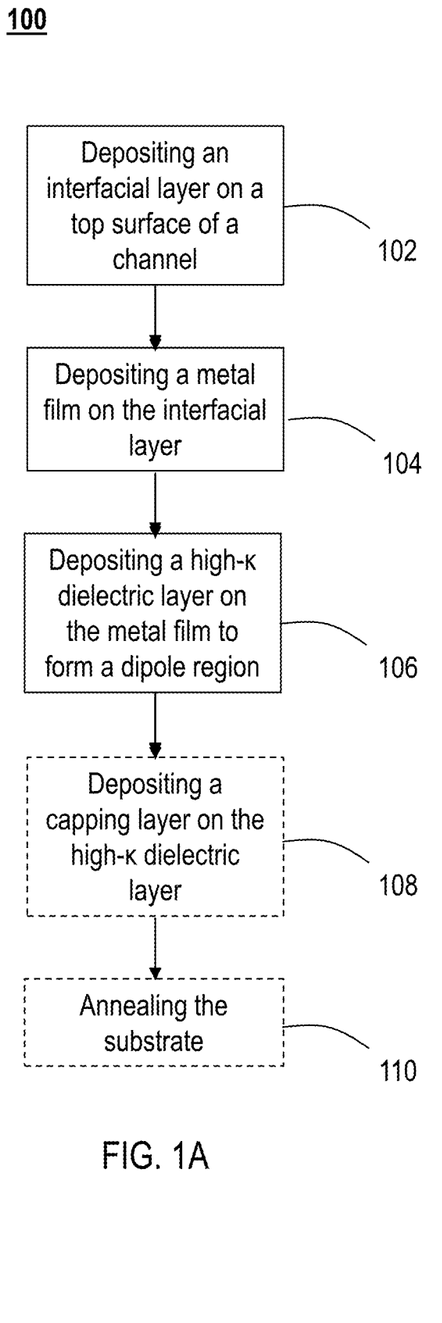
FIG. 1A depicts a process flow diagram of one embodiment of a method according to embodiments described herein.

FIG. 1A depicts a flow diagram of a method 100 of manufacturing an electronic device in accordance with one or more embodiments of the present disclosure. With reference to FIG. 1A, the method 100 begins at operation 102 by depositing an interfacial layer on a top surface of a channel located between a source and a drain on a substrate. At operation 104, a metal film is deposited on the interfacial layer. At operation 106, a high-κ dielectric layer is deposited on the metal film to form a dipole region. At operation 108, a capping layer (i.e., an in situ capping layer) is optionally deposited on the high-κ dielectric layer. At operation 110, the substrate is optionally annealed.

Figure 1B:
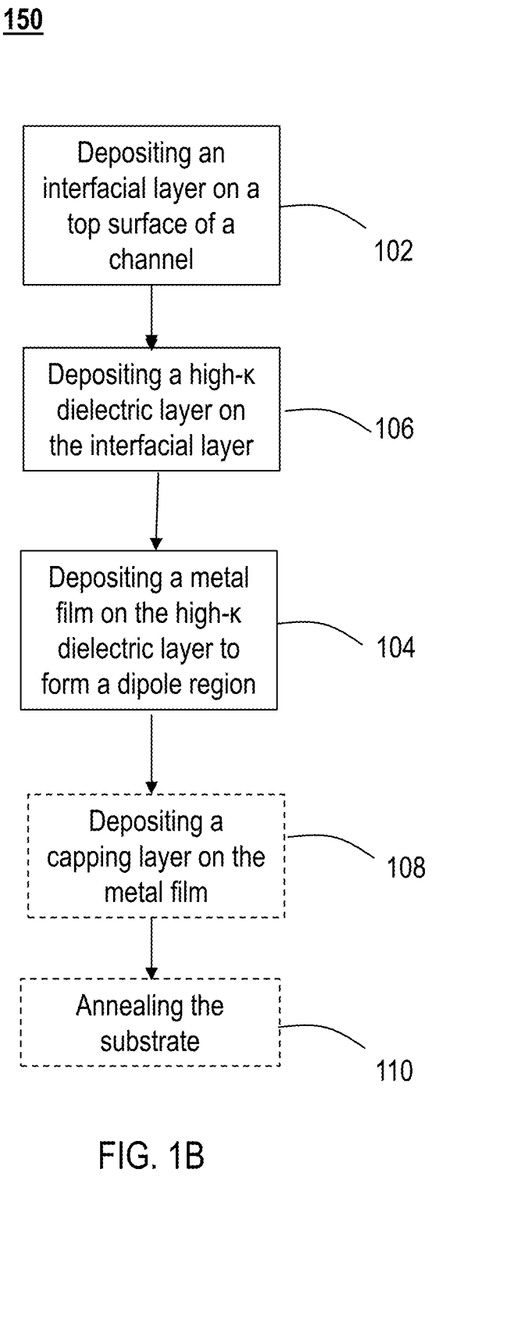
FIG. 1B depicts a process flow diagram of one embodiment of a method according to embodiments described herein.

FIG. 1B depicts a flow diagram of a method 150 of manufacturing an electronic device in accordance with one or more embodiments of the present disclosure. With reference to FIG. 1B, the method 150 begins at operation 102 by depositing an interfacial layer on a top surface of a channel located between a source and a drain on a substrate. At operation 106, a high-κ dielectric layer is deposited on the interfacial layer. At operation 104, a metal film is deposited on the high-κ dielectric layer to form a dipole region. At operation 108, a capping layer (i.e., an in situ capping layer) is optionally deposited on the metal film. At operation 110, the substrate is optionally annealed.

FIG. 2A-2D are cross-sectional views of an electronic device (e.g., a transistor such as a FinFET or GAA) 200 according to one or more embodiments. The electronic devices 200 shown in FIGS. 2A-2D may be manufactured by the method 100, 150 illustrated in FIGS. 1A and 1B. In some embodiments, the electronic devices 200 are manufactured by method 100 illustrated in FIG. 1A.

FIG. 3A-3D are cross-sectional views of an electronic device (e.g., a transistor such as a FinFET or GAA) 300 according to one or more embodiments. The electronic devices 300 shown in FIGS. 3A-3D may be manufactured by the method 100, 150 illustrated in FIGS. 1A and 1B. The electronics devices 300 may have any of the same features or properties as the electronic devices 200 described with respect to FIGS. 2A-2D. In one or more embodiments, the electronic devices 300 shown in FIGS. 3A-3D are manufactured by the method 150 illustrated in FIG. 1B.

Figure 2A:
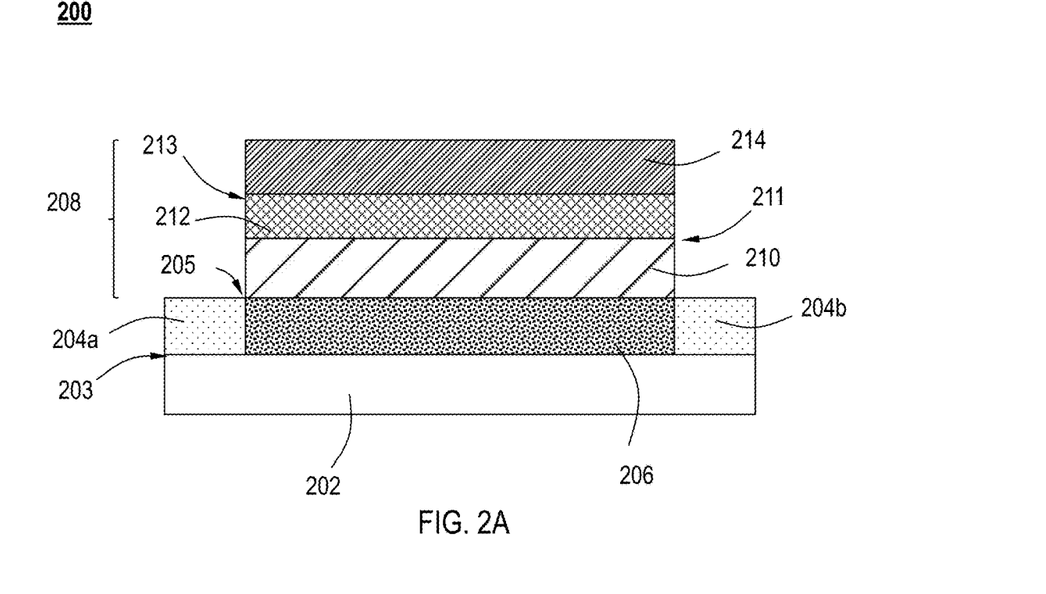
FIG. 2A illustrates a cross-sectional view of a substrate according to one or more embodiments.

In one or more embodiments, the electronic device 200 comprises a semiconductor substrate 202 having a top surface 203. The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 202 comprises one or more of silicon (Si), germanium (Ge), gallium (Ga), arsenic (As), indium (In), phosphorus (P), or selenium (Se). Although a few examples of materials from which the substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 202 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers.

In one or more embodiments, a source region 204a is on the top surface 203 of the semiconductor substrate 202. In one or more embodiments, the source region 204a has a source and a source contact (not illustrated). A drain region 204b is on the top surface 203 of the semiconductor substrate 202 opposite the source region 204a. In one or more embodiments, the drain region 204b has a drain and a drain contact (not illustrated).

In one or more embodiments, the source region 204a and/or the drain region 204b can be any suitable material known to the skilled artisan. In one or more embodiments, the source region 204a and/or the drain region 204b may have more than one layer. For example, the source region 204a and/or the drain region 204b may independently comprise three layers. In one or more embodiments, the source region 204a and the drain region 204b may independently comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source region 204a and the drain region 204b may independently comprise a bottom layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like. In some embodiments, the source region 204a and the drain region 204b may be raised source/drain regions formed by EPI growth.

In one or more embodiments, the source contact and/or the drain contact may independently be selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more embodiments, formation of the source contact and/or the drain contact is conducted by any suitable process known to the skilled artisan, including, but not limited to ALD, CVD, PVD, MBE, MOCVD, spin-on, or other insulating layer deposition techniques known to the skilled artisan.

In one or more embodiments, a channel 206 is located between the source 204a and the drain 204b. In one or more embodiments, a dipole region 208 overlies the channel 206 and is in contact with one or more of the channel 206, the source region 204a, and the drain region 204b. In one or more embodiments, the dipole region 208 has a thickness in a range of from 15 Å to 50 Å, or in a range of from 15 Å to 45 Å, or in a range of from 15 Å to 40 Å, or in a range of from 15 Å to 35 Å.

In one or more embodiments, the dipole region 208 comprises one or more of an interfacial layer 210, a metal film 212, and a high-κ dielectric layer 214. In one or more embodiments, at operation 102, an interfacial layer 210 is deposited on a top surface 205 of the channel 206. In one or more embodiments, the interfacial layer 210 can be any suitable material known to the skilled artisan. For example, in one or more embodiments, the interfacial layer 210 comprises a dielectric material. In one or more embodiments, the dielectric material is selected from one or more of silicon (Si), silicon dioxide ($SiO_2$), silicon nitride (SiN), silicon oxynitride (SiON), silicon oxycarbide (SiOC), silicon carbon oxynitride (SiCONH), doped silicon, doped silicon oxide, doped silicon nitride, doped silicon oxynitride, spin-on dielectrics, or diffusion species growths. In one or more embodiments, the interfacial layer 210 comprises silicon dioxide ($SiO_2$). In other embodiments, the dielectric material is a low-K material. The interfacial layer 210 can be deposited using one or more deposition techniques known to one of ordinary skill in the art of microelectronic device manufacturing. In one or more embodiments, the interfacial layer 210 is deposited using one of deposition techniques, such as, but not limited to, ALD, CVD, PVD, MBE, MOCVD, spin-on, or other insulating layer deposition techniques known to the skilled artisan. In one or more embodiments, the interfacial layer 210 may be formed by etching and forming an oxide on the top surface 205 of the channel 206. In one or more embodiments, the interfacial layer 210 has a thickness in a range of 1 Å to 10 Å.

In one or more embodiments, a wet chemistry technique is performed to form the interfacial layer 210. The wet chemistry technique may be any technique known to the skilled artisan. In some embodiments, the wet chemistry technique includes a pre-clean process. In some embodiments, the pre-clean process includes using a SC-1 solution comprising one or more of ozone, ammonium hydroxide or hydrogen peroxide. In some embodiments, the pre-clean process includes using a SC-1 solution without ozone, ammonium hydroxide or hydrogen peroxide. In some embodiments, after using the SC-solution, the pre-clean process includes using dilute hydrofluoric acid (dilute HF) to etch away native oxide on the semiconductor substrate 202 to form a hydrophobic surface (i.e., the interfacial layer 210).

Figure 2B:
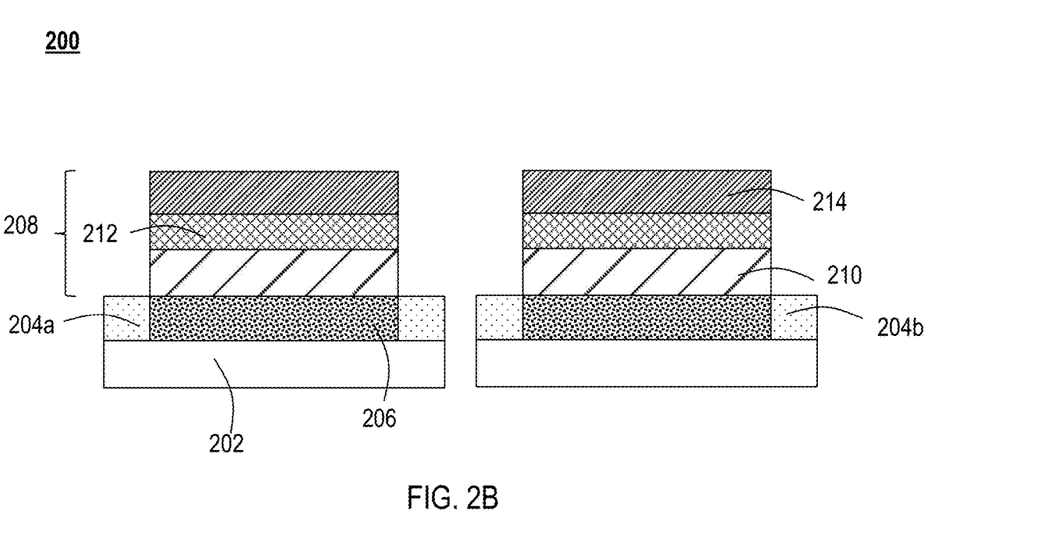
FIG. 2B illustrates a cross-sectional view of a substrate according to one or more embodiments.

In one or more embodiments, at operation 104, a metal film 212 is deposited on a top surface 211 of the interfacial layer 210. In one or more embodiments, the metal film 212 is deposited using one of deposition techniques, such as, but not limited to, ALD, CVD, PVD, MBE, MOCVD, spin-on, or other insulating layer deposition techniques known to the skilled artisan. In one or more specific embodiments, the metal film 212 is deposited by atomic layer deposition (ALD). In one or more embodiments, the metal film 212 is deposited by atomic layer deposition (ALD) at a temperature in the range of about 200° C. to about 600° C. In one or more embodiments, the metal film 212 is deposited by atomic layer deposition (ALD) at a temperature less than or equal to about 450° C. In one or more embodiments, the metal film 212 has a thickness in a range of 1 Å to 10 Å, or in a range of 2 Å to 5 Å. In one or more specific embodiments, the metal film 212 has a thickness in a range of 3 Å to 4 Å.

In one or more embodiments, the metal film 212 is free or substantially free of non-metal atoms. As used herein, the term "substantially free" means that there is less than about 5%, including less than about 4%, less than about 3%, less than about 2%, less than about 1%, and less than about 0.5% of non-metal atoms, on an atomic basis, in the metal film 212.

In conventional dipole engineering techniques, a metal oxide film is deposited on an interlayer dielectric, followed by an annealing process. The spike anneal can potentially cause an equivalent oxide thickness (EOT) penalty and high thermal budget because free oxygen atoms in the gate dielectric layers and the overlaying dipole stack diffuse downward to oxidize the underlying silicon layer. Without intending to be bound by theory, it is thought that depositing a metal film that is free or substantially free of non-metal atoms, as described herein, requires less energy than conventional dipole engineering techniques, which need to break up metal-oxygen (M-O) bonds. The metal film 212 described herein advantageously permits metal atoms to diffuse into the interfacial layer 210 and the high-κ dielectric layer 214 to form the dipole region 208 without a spike anneal process. Additionally, a metal film that is free or substantially free of non-metal atoms, as described herein, enables tuning of the thickness of the metal film. Advantageously, the metal film that is free or substantially free of non-metal atoms, as described herein, is free or substantially free of impurities (i.e., oxygen). In one or more embodiments, an in situ capping layer 216 is deposited to control film oxidation after deposition.

In one or more embodiments, the channel 206 comprises n-type material and the metal film 212 comprises one or more of lanthanum (La), cerium (Ce), praseodymium (Pr), neodymium (Nd), promethium (Pm), samarium (Sm), europium (Eu), gadolinium (Gd), terbium (Tb), dysprosium (Dy) holmium (Ho), erbium (Er), thulium (Tm), ytterbium (Yb), lutetium (Lu), magnesium (Mg), scandium (Sc), strontium (Sr), yttrium (Y), zirconium (Zr), or caesium (Cs).

In one or more embodiments, the channel 206 comprises p-type material and the metal film 212 comprises one or more of aluminum (Al), titanium (Ti), gallium (Ga), germanium (Ge), selenium (Se), indium (In), tin (Sn), antimony (Sb), tellurium (Te), tantalum (Ta), tungsten (W), or molybdenum (Mo).

In other embodiments, the metal film 212 comprises a metal. In some embodiments, the metal film 212 comprises titanium aluminum (TiAl).

In one or more embodiments, the metal film 212 comprises one or more of a metal, a metal carbide, a metal nitride, or a metal oxide. In one or more specific embodiments when the metal film 212 comprises one or more of a metal carbide, a metal nitride, or a metal oxide, the method 100 further comprises performing a radical treatment (not illustrated) to remove carbide, nitride and oxide from each of the metal carbide, the metal nitride, or the metal oxide. The radical treatment process may include any process of removing carbide, nitride and oxide known by the skilled artisan. In one or more embodiments, the radical treatment includes introduction of radicals comprising one or more of H*, OH*, O*, $N_2$*, $NH_3$* or $H_2O$*. In some embodiments, the radicals are generated by forming a plasma from a radical gas. In some embodiments, the plasma is generated by a remote plasma source.

Referring to FIGS. 2A-2D, in one or more embodiments, at operation 106, a high-κ dielectric layer 214 is deposited on a top surface 213 of the metal film 212. The high-κ dielectric layer 214 can be any suitable high-κ dielectric material known to the skilled artisan. In one or more embodiments, the high-κ dielectric layer 214 comprises one or more of hafnium oxide ($HfO_x$), zirconium oxide ($ZrO_x$), or hafnium zirconium (HfZr). In one or more embodiments, the high-κ dielectric layer 214 is deposited using one of deposition techniques, such as, but not limited to, ALD, CVD, PVD, MBE, MOCVD, spin-on, or other insulating layer deposition techniques known to the skilled artisan. In one or more embodiments, the high-κ dielectric layer 214 has a thickness in a range of 10 Å to 25 Å.

Referring to FIGS. 3A-3D, a high-κ dielectric layer 214 is deposited on a top surface 211 of the interfacial layer 210 at operation 106. In FIGS. 3A-3D, a metal film 212 is deposited high-κ dielectric layer 214 at operation 104 to form the dipole region 208.

Figure 2C:
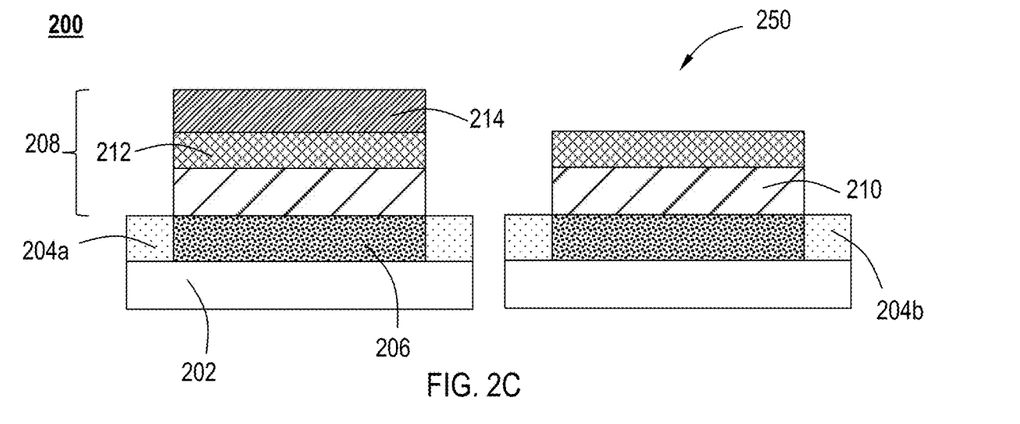
FIG. 2C illustrates a cross-sectional view of a substrate according to one or more embodiments.

With reference to FIG. 2C*, in one or more embodiments, the electronic device 200 comprises alternating layers of metal film 212 and high-κ dielectric layer 214. In one or more embodiments, the electronic device 200 comprises in a range of from 1 pair to 5 pairs of alternating layers of metal film 212 and high-κ dielectric layer 214 to form a multilayer stack. In one or more embodiments, the multilayer stack comprising metal film 212 and high-κ dielectric layer 214 has a thickness in a range of from 10 Å to 40 Å, or in a range of from 11 Å to 35 Å.

Figure 2D:
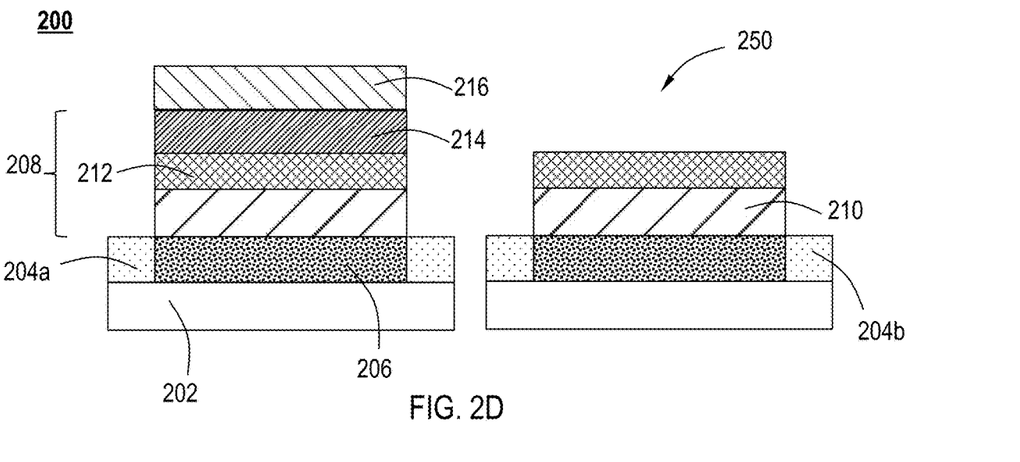
FIG. 2D illustrates a cross-sectional view of a substrate according to one or more embodiments.

Referring to FIG. 2D, in some embodiments, the method 100 optionally includes, at operation 108, depositing a capping layer 216 on a top surface of the dipole region 208 (i.e., on a top surface of the high-κ dielectric layer 214) to control film oxidation after deposition. In one or more embodiments, the capping layer 216 is an in situ capping layer. Referring to FIG. 3D, in some embodiments, the method 105 optionally includes, at operation 108, depositing a capping layer 216 on a top surface of the dipole region 208 (i.e., on a top surface of the metal film 212) to control film oxidation after deposition. The capping layer 216 can be any suitable material known to the skilled artisan. In one or more embodiments, the capping layer 216 comprises one or more of titanium nitride (TiN), titanium silicon nitride (TiSiN), tantalum nitride (TaN), silicon (Si), or titanium aluminum (TiAl). In one or more embodiments, the capping layer 216 comprises a noble metal. In one or more embodiments, the capping layer 216 comprises one or more of ruthenium (Ru), rhodium (Rh), palladium (Pd), osmium (Os), iridium (Ir), platinum (Pt), gold (Au), or silver (Ag). In FIG. 2D, the high-κ dielectric layer 214 on the PFET side 250 is removed by patterning. In FIG. 3D, the metal film 212 on the PFET side 250 is removed by patterning.

In one or more embodiments, the method 100 optionally includes, at operation 110, annealing the semiconductor substrate 202 at a temperature in a range of 400° C. to 900° C. to drive particles of metal from the metal film 212 into the high-κ dielectric layer 214. In one or more embodiments, the method 105 optionally includes, at operation 110, annealing the semiconductor substrate 202 at a temperature in a range of 400° C. to 900° C. to drive particles of metal from the metal film 212 into the interfacial layer 210. Without intending to be bound by theory, it is thought that annealing the semiconductor substrate 202 according to operation 110 drives an increased number of particles of metal from the metal film 212 into one or more of the interfacial layer 210 or the high-κ dielectric layer 214, as compared to methods where annealing does not occur. In one or more embodiments, annealing the substrate at operation 110 includes a rapid thermal process (RTP). The RTP may be any suitable process known to the skilled artisan. Without intending to be bound by theory, the RTP is believed to densify and improve the physical properties of the deposited metal film.

Without intending to be bound by theory, it is thought that a dipole region comprising a channel having n-type material or p-type material, and a metal film as described above, simplifies the existing integration flow, reducing the integration costs. Additionally, when metal atoms from the metal film 212 are embedded in each of the interfacial layer 210 and the high-κ dielectric layer 214, the dipole region 208 is formed and it is thought that oxidation can be reduced, which would potentially reduce the annealing temperature required.

Figure 3A:
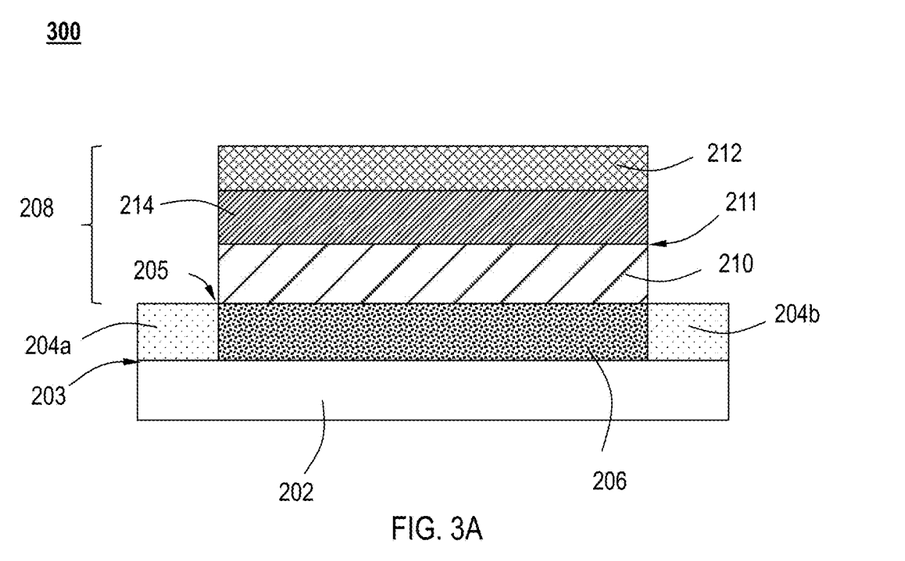
FIG. 3A illustrates a cross-sectional view of a substrate according to one or more embodiments.
Figure 3B:
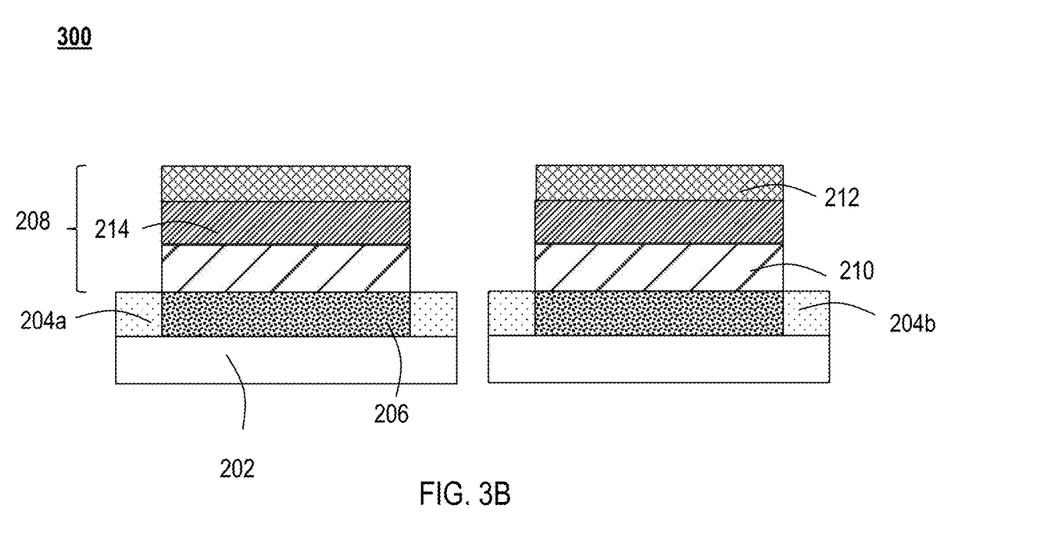
FIG. 3B illustrates a cross-sectional view of a substrate according to one or more embodiments.
Figure 3C:
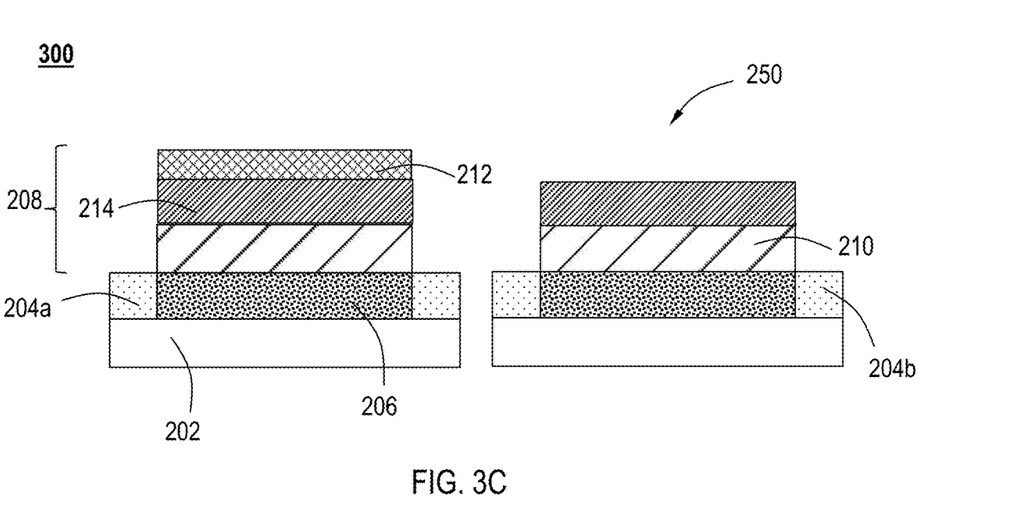
FIG. 3C illustrates a cross-sectional view of a substrate according to one or more embodiments.
Figure 3D:
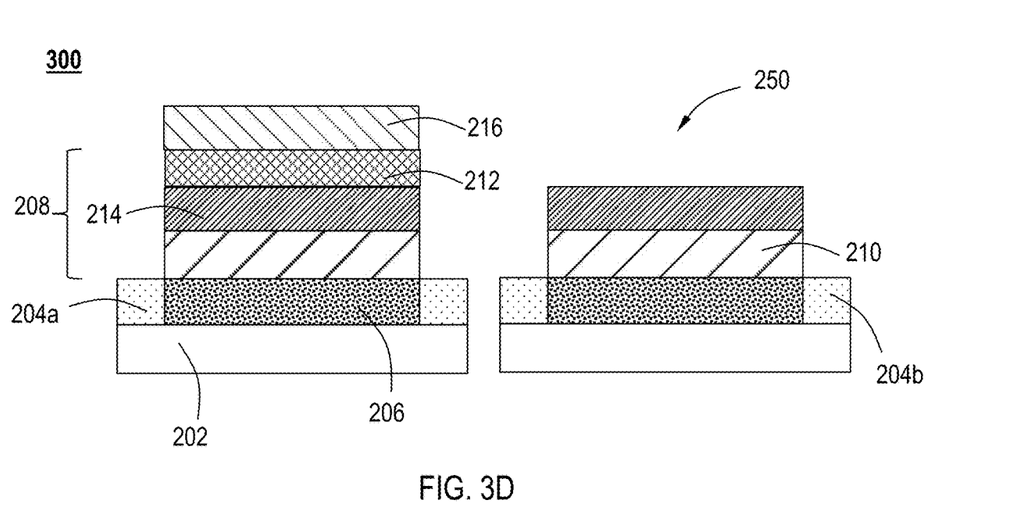
FIG. 3D illustrates a cross-sectional view of a substrate according to one or more embodiments.

Referring to FIGS. 2B-2C and 3B-3C, in one or more embodiments, the metal film 212 is deposited by atomic layer deposition (ALD) at a temperature in the range of about 200° C. to about 600° C. In one or more embodiments, the metal film 212 is deposited by atomic layer deposition (ALD) at a temperature less than or equal to about 450° C. Referring to FIGS. 2C-2D, in one or more embodiments, the high-κ dielectric layer 214 on the PFET side 250 is removed by patterning. Referring to FIGS. 3C-3D, in one or more embodiments, the metal film 212 on the PFET side 250 is removed by patterning.

In one or more embodiments, a gate comprising one or more of a gate metal (not illustrated) or a gate contact (not illustrated) may optionally be formed or deposited on the exposed surface of the dipole region 208. The gate metal may be any material known to one of skill in the art. In one or more embodiments, the gate metal comprises one or more of nitrogen (N), copper (Cu), cobalt (Co), tungsten (W), titanium (Ti), tantalum (Ta), molybdenum (Mo), nickel (Ni), ruthenium (Ru), silver (Ag), gold (Au), iridium (Ir), aluminum (Al), or platinum (Pt). In one or more specific embodiments, the gate metal comprises a metal selected from one or more of nitrogen (N), cobalt (Co), tungsten (W), titanium (Ti), molybdenum (Mo), nickel (Ni), ruthenium (Ru), silver (Ag), iridium (Ir), aluminum (Al), or platinum (Pt). In other specific embodiments, the gate metal 226 comprises a metal selected from one or more of nitrogen (N), cobalt (Co), tungsten (W), titanium (Ti), molybdenum (Mo), or ruthenium (Ru). In one or more embodiments, the gate contact may be any suitable material known to the skilled artisan. In one or more embodiments, the gate contact is selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), aluminum (Al), or platinum (Pt).

Figure 4:
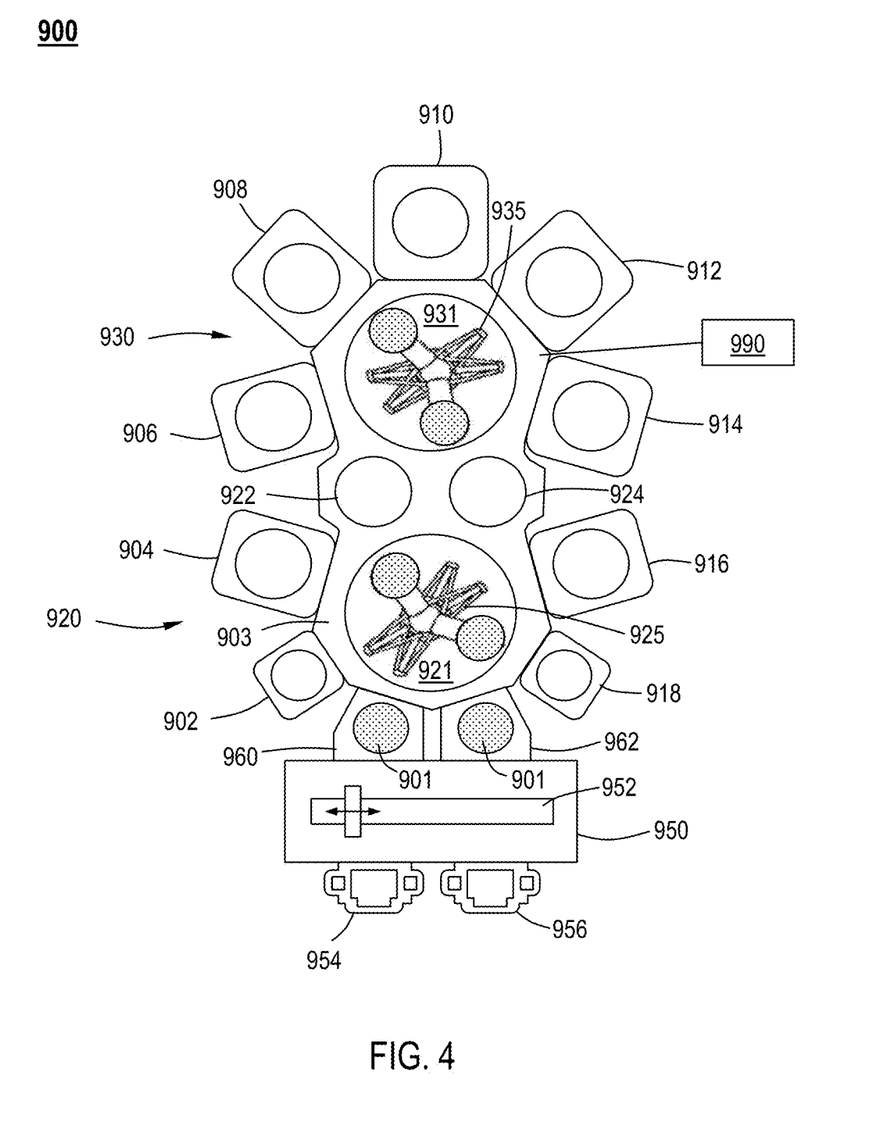
FIG. 4 illustrates a cluster tool according to one or more embodiments of the disclosure.

Additional embodiments of the disclosure are directed to processing tools (i.e., a cluster tool) 900 for the formation of the logic/memory devices and methods described, as shown in FIG. 4. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station 921, 931. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. The particular arrangement of process chambers and components can be varied depending on the cluster tool and should not be taken as limiting the scope of the disclosure.

In one or more embodiments, the cluster tool 900 includes a silicon dioxide (SiO$_2$) chamber to deposit silicon dioxide (SiO$_2$). The silicon dioxide (SiO$_2$) deposition chamber of some embodiments comprises an atomic layer deposition chamber, a plasma enhanced atomic layer deposition chamber, or a spatial atomic layer deposition chamber. In one or more embodiments, the cluster tool 900 includes a pre-cleaning chamber connected to the central transfer station.

In the embodiment shown in FIG. 4, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown in FIG. 4 has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or to allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes the processing chamber to perform the operations of any of the methods 100, 150 described herein. In one or more embodiments, the controller causes the processing chamber to perform the operations of method 100. In one or more embodiments, the controller causes the processing chamber to perform the operations of depositing an interfacial layer on a top surface of a channel located between a source and a drain on a substrate (operation 102), depositing a metal film on the interfacial layer (operation 104), depositing a high-κ dielectric layer on the metal film to form a dipole region (operation 106), optionally depositing a capping layer on the high-κ dielectric layer (operation 108), and optionally annealing the substrate (operation 110).

In one or more embodiments, the controller causes the processing chamber to perform the operations of method 150. In one or more embodiments, the controller causes the processing chamber to perform the operations of depositing an interfacial layer on a top surface of a channel located between a source and a drain on a substrate (operation 102), depositing a high-κ dielectric layer on the interfacial layer (operation 106), deposition metal film on the high-κ dielectric layer to form a dipole region (operation 104), optionally depositing a capping layer on the metal film (operation 108), and optionally annealing the substrate (operation 110).

In one or more specific embodiments when the metal film comprises one or more of a metal carbide, metal nitride, or a metal oxide, the controller causes the processing chamber to perform the unillustrated operation of performing a radical treatment to remove carbide, nitride, and oxide from each of the metal carbide, the metal nitride, or the metal oxide. The radical treatment process may include any process of removing carbide, nitride and oxide known by the skilled artisan. In one or more embodiments, the radical treatment includes introduction of radicals comprising one or more of one or more of H*, OH*, O*, $N_2$*, $NH_3$* or $H_2O$*. In some embodiments, the radicals are generated by forming a plasma from a radical gas. In some embodiments, the plasma is generated by a remote plasma source.

In one or more embodiments, the processing tool 900 comprises a central transfer station 921, 931 comprising at least one robot 925, 935 configured to move a wafer; one or more of a rapid thermal processing (RTP) station, a decoupled plasma oxidation (DPO), or decoupled plasma nitridation (DPN) station connected to the central transfer station; an atomic layer deposition (ALD) station connected to the central transfer station; an optional pre-clean station connected to the central transfer station; and at least one controller connected to the one or more of the central transfer station, the RTP station, the DPO station, the DPN station, the ALD station or the optional pre-clean station. In one or more embodiments, the at least one controller has at least one configuration selected from: a configuration to move the wafer between stations using the robot; a configuration to perform a rapid thermal process; a configuration to perform a decoupled plasma process; a configuration to control a flow of an oxidizing gas into the RTP station or DPO station; a configuration to control a flow of a nitriding gas into the RTP station or DPN station; a configuration to deposit a silicon oxide film by atomic layer deposition; and a configuration to pre-clean the wafer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:
   depositing an interfacial layer on a top surface of a channel located between a source and a drain on a substrate;
   depositing a metal film on the interfacial layer, the metal film comprising titanium aluminum (TiAl); and
   depositing a high-κ dielectric layer on the metal film to form a dipole region.

2. The method of claim 1, wherein the interfacial layer comprises a dielectric material.

3. The method of claim 2, wherein the dielectric material is selected from one or more of silicon (Si), silicon dioxide ($SiO_2$), doped silicon, doped silicon oxide, or spin-on dielectrics.

4. The method of claim 1, wherein the channel comprises n-type material and the metal film comprises one or more of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), magnesium (Mg), scandium (Sc), strontium (Sr), yttrium (Y), zirconium (Zr), or caesium (Cs).

5. The method of claim 1, wherein the channel comprises p-type material and the metal film comprises one or more of aluminum (Al), titanium (Ti), gallium (Ga), germanium (Ge), selenium (Se), indium (In), tin (Sn), antimony (Sb), tellurium (Te), tantalum (Ta), tungsten (W), or molybdenum (Mo).

6. The method of claim 1, wherein the high-κ dielectric layer comprises one or more of hafnium oxide (HfOx), zirconium oxide (ZrOx), or hafnium zirconium (HfZr).

7. The method of claim 1, wherein the electronic device comprises alternating layers of metal film and high-κ dielectric layer.

8. The method of claim 1, further comprising annealing the substrate at a temperature in a range of 400° C. to 900° C. to drive particles of metal from the metal film into the high-κ dielectric layer.

9. The method of claim 1, further comprising depositing a capping layer on the dipole region, the capping layer comprising one or more of titanium nitride (TiN), titanium silicon nitride (TiSiN), tantalum nitride (TaN), silicon (Si), or titanium aluminum (TiAl).

* * * * *